United States Patent [19]

Dreyer et al.

[11] Patent Number: 5,049,811
[45] Date of Patent: Sep. 17, 1991

[54] MEASURING INTEGRITY OF SEMICONDUCTOR MULTI-LAYER METAL STRUCTURES

[75] Inventors: Michael Dreyer; Robert L. Duffin, both of Mesa, Ariz.

[73] Assignee: Motorola, Inc., Schaumburg, Ill.

[21] Appl. No.: 546,635

[22] Filed: Jul. 2, 1990

[51] Int. Cl.$^5$ ............................................. G01R 15/12
[52] U.S. Cl. .............................. 324/158 R; 324/73.1; 324/612; 324/613
[58] Field of Search .................. 324/158 R, 537, 538, 324/500, 73.1, 501, 77 B, 77 D, 77 G, 612, 613, 614; 437/8; 364/487

[56] References Cited

U.S. PATENT DOCUMENTS

| | | | |
|---|---|---|---|
| 3,851,245 | 11/1974 | Baker et al. | 324/537 |
| 3,983,479 | 9/1976 | Lee et al. | 324/158 R |
| 4,430,611 | 2/1984 | Boland | 324/77 B |
| 4,516,071 | 5/1985 | Buehler | 324/158 R |
| 4,651,088 | 3/1987 | Sawada | 324/158 R |
| 4,720,670 | 1/1988 | Boyle | 324/158 R |
| 4,720,671 | 1/1988 | Tada et al. | 324/158 R |
| 4,950,999 | 8/1990 | Agnello et al. | 324/77 D |

OTHER PUBLICATIONS

Chen et al., "Prediction of Electromigration in VLSI Circuits Using Noise Measurements as Tool"; Fifth Quarterly Progress Report (Department of Electrical Engineering, University of South Florida); Jan. 12, 1989, pp. 1–25.
"Imager 3300-Multifunction, Nondestructive Inspection System for Process Development and Control"; Therma-Wave, Inc.
Smith et al., "Evaluating Voids and Microcracks in Al Metalization"; Semiconductor International; Jan. 1990.
Valdes; "About the Measurement and Interpretation of Low Frequency Noises"; Review of Scientific Instruments, vol. 61, No. 12, 1984.

Primary Examiner—Kenneth A. Wieder
Assistant Examiner—Vinh P. Nguyen
Attorney, Agent, or Firm—Joe E. Barbee

[57] ABSTRACT

A fast, nondestructive, and low cost method for measuring the integrity of semiconductor multi-layer conducting structures uses a voltage spectral density technique. The method compares the magnitude and frequency of generally non-periodic low frequency voltages induced by direct current flow in test structures to the same parameters of a defect free structure.

12 Claims, 4 Drawing Sheets

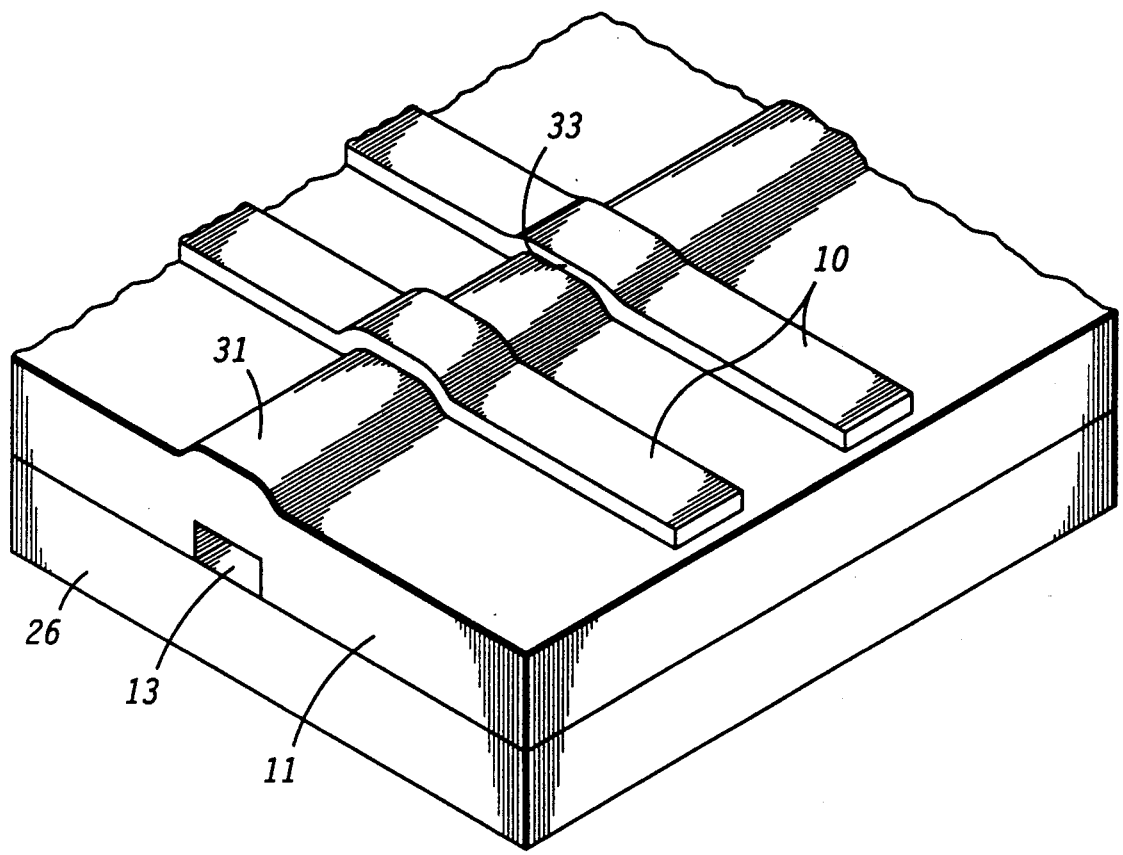
FIG. 6
FIG. 7
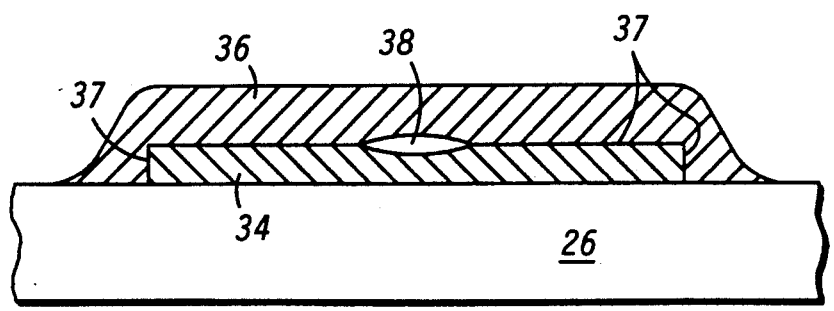

MEASURING INTEGRITY OF SEMICONDUCTOR MULTI-LAYER METAL STRUCTURES

BACKGROUND OF THE INVENTION

This invention relates, in general, to evaluating the integrity of semiconductor metal structures, and more particularly, to measurement techniques for detecting defects in semiconductor metal structures.

During semiconductor manufacturing, defects can occur in the semiconductor's metal structures which, if undetected, can eventually result in malfunctions or complete failure of the manufactured product. Defects can result from a variety of sources including malfunctioning or misaligned equipment, particulates on the semiconductor material, residues remaining on the semiconductor material from previous manufacturing steps, and various other sources. With the increasing emphasis on quality in the manufacturing of semiconductor devices, manufacturing procedures generally include inspections for determining the presence of defects in conductive lines. Measurement techniques used to perform these inspections include SEM (scanning electron microscope) views of semiconductor surfaces, or cross sections; and thermal wave measurement techniques.

SEM surface photographs limit evaluations to semiconductor surface metalization features. SEM analysis of multi-layer metal system subsurface features requires SEM photographs of the metal structure's cross section. Although this technique provides detailed information concerning the semiconductor's structure, it has the disadvantage of being destructive since it requires slicing the die to expose the cross sectional view. Another disadvantage of the SEM analysis technique is the time required to prepare and analyze the many SEM photographs needed to adequately represent an entire semiconductor. These disadvantages, the time required to complete examinations and the destruction resulting from cross sectioning, have limited the use of SEM analysis as a tool for detecting defects during semiconductor manufacturing.

Thermal wave measurement analysis, which employs heating a semiconductor die with lasers then measuring the resulting thermal vibrations of the material's lattice structure, can also be used in detecting defects. As with SEM analysis, this technique also requires several views to represent an entire semiconductor and considerable time for analysis. Other disadvantages of thermal wave analysis are the resolution decrease associated with increased defect depth into the material, and high equipment cost.

Accordingly it would be desirable to have a nondestructive, rapid, and inexpensive method of detecting the presence of defects in semiconductor conductive lines that overcomes the problems of previous detection techniques.

SUMMARY OF THE INVENTION

The objects and advantages of the present invention are achieved by forcing direct current flow through a semiconductor metal structure. Voltages with generally non-periodic frequencys are generated by the current flow and are converted to a voltage spectral density. This voltage spectral density is then compared to the voltage spectral density of a defect free metal structure. A larger voltage spectral density value for the test sample indicates the presence of defects in its metal structure. This method provides a fast, nondestructive, and low cost method of determining defects.

BRIEF DESCRIPTION OF THE DRAWINGS

FIG. 6 is an isometric cut-away side view of a portion of a metal structure crossing a surface discontinuity; and FIG. 7 is a cut-away side view of a layered metal structure with a defect.

DETAILED DESCRIPTION OF THE DRAWINGS

As direct current flows in straight defect free conductors, generally non-periodic low frequency voltages are created by the movement of electrons in the conductor's atomic structure. At current densities between 0.1 million amps per square centimeter and 3 million amps per square centimeter, these induced low frequency voltages are referred to as noise voltages. A plot of noise voltage magnitude verses frequency (a voltage spectrum or voltage spectral density) shows voltage values peak around 1 Hz and decrease as the voltage frequency increases. At frequencies from 1 Hz to about 10 Hz, the voltage spectrum magnitude decreases 10 db for every decade of frequency. Above these frequencies the value is approximately constant. A plot illustrating these characteristics is generally referred to as a 1 over f (1/f) plot indicating the value changes 10 db per decade.

The 1/f characteristics of current flow in conductors will be used to specifically focus on solving problems encountered in manufacturing semiconductors.

In defect free conductors, current flow is generally considered laminar or smooth (without ripples or disturbances). Changes in the conductor's shape, such as a hole in the conductor or changing the conductor's thickness, disturb current flow in the area of the change. The flow is no longer laminar but has ripples or disturbances. These disturbances increase vibrations of electrons in the conductor's atomic structure and result in an increased noise voltage magnitude. The voltage spectrum curve resulting from non-laminar current flow retains the same shape with only a change in its magnitude. The increased 1/f magnitude can be used to determine the presence of defects.

For applied current densities greater than three million amps per square centimeter, Joule heating occurs in the conductor creating electromigration of the conductor atoms and disrupting the currents laminar flow. The voltage spectrum at these currents cannot be used to detect defects.

Even though conductive lines in the present disclosure will be referred to as being metal, it will be understood that the present invention is just as applicable to other conductive lines such as polysilicon lines or the like.

Figure 1:
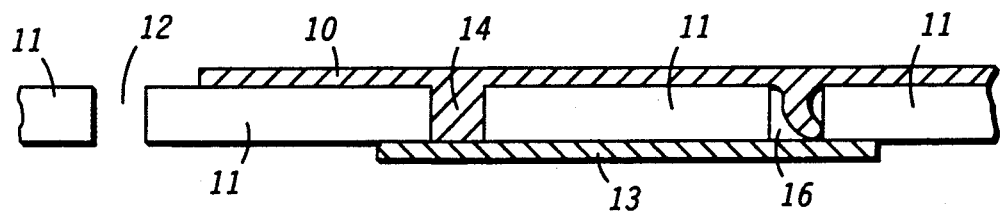
FIG. 1 is a cut-away side view of a portion of a semiconductor multi-layer metal structure.

FIG. 1 is a cross sectional view of a portion of a semiconductor multi-layer metal structure. An upper metal layer 10 is separated from a lower metal layer 13 by an insulator 11. Metal layers 10 and 13 along with insulator or dielectric 11 are situated on a semiconductor substrate in a conventional fashion. Via 12 is a hole in the insulator. Metal filled via 14, provides electrical continuity between metal layers 10 and 13. During semiconductor manufacturing, contamination in the vias can block metal flow into the via creating void 16 and reducing the via's current carrying capability. The reduced current capability can result in overheating and can eventually result in an open circuit due to overheating from the reduced metal area. Void 16 can be detected by analyzing the via's 1/f characteristics.

Figure 2:
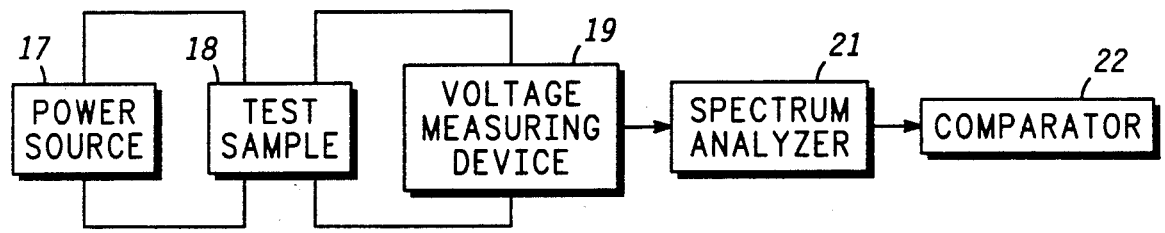
FIG. 2 is a block diagram illustrating the major components of a defect detection system and how they are connected.

FIG. 2 is a block diagram illustrating the major components and interconnections of a measurement system for determining the noise voltage spectrum of a semiconductor device. Power source 17 is a means for applying a direct current to a semiconductor metal structure 18 that is to be tested. To insure accurate measurements, the current source must not itself be a source of noise voltages. In a preferred embodiment, a low noise battery and resistor function as the direct current source supplying between 0.1 million amps per square centimeter and 3 million amps per square centimeter. Voltages with frequencies that are generally non-periodic are measured by voltage measuring device 19. The voltage spectral density for sample 18 is calculated from the measured voltages by spectrum analyzer 21. Comparator 22 compares the calculated voltage spectral density to a predetermined reference. In a preferred embodiment, spectrum analyzer 21 includes a computer that performs a Fast Fourier transform algorithm to convert the voltage measurements to a voltage spectral density and to compare it to a predetermined reference.

Figure 3:
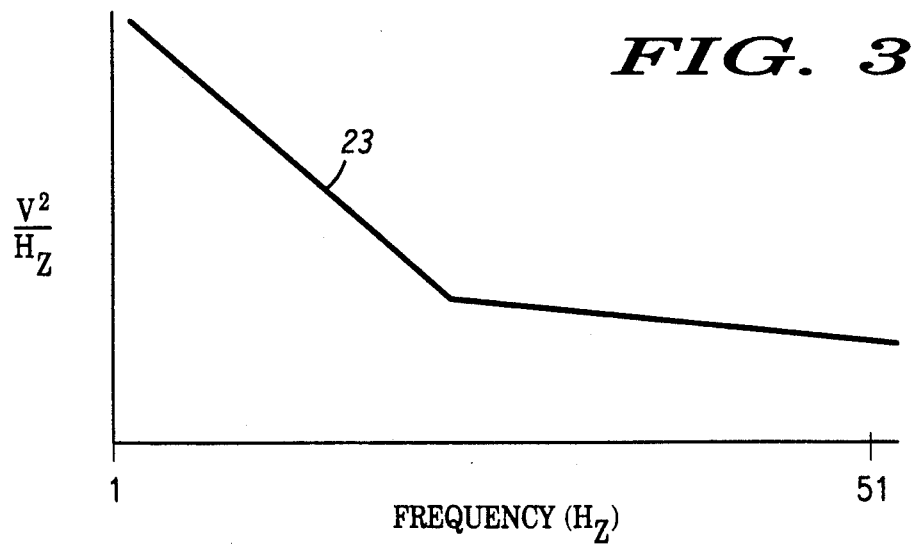
FIG. 3 is a voltage spectral density graph that is produced by the detection system and is used to identify defects.

FIG. 3 is a metal structure's voltage spectral density graph with a logarithmic vertical and horizontal axes. The noise voltage amplitude peaks at 1 Hz and, at low frequencies, exhibits the 1/f characteristic 23 of decreasing at a 10 db per decade rate. At higher frequencies, the magnitude remains approximately constant. In the preferred mode, the magnitude at 1 Hz is compared to the magnitude of a defect free reference. A problem or defect is indicated if the test sample conductive line has a higher reading at 1 Hz than the reference. The lower the voltage spectral density magnitude at 1 Hz, the less current crowding at a particular location along a conductive line being tested, and less current crowding means a more defect free line.

Figure 4:
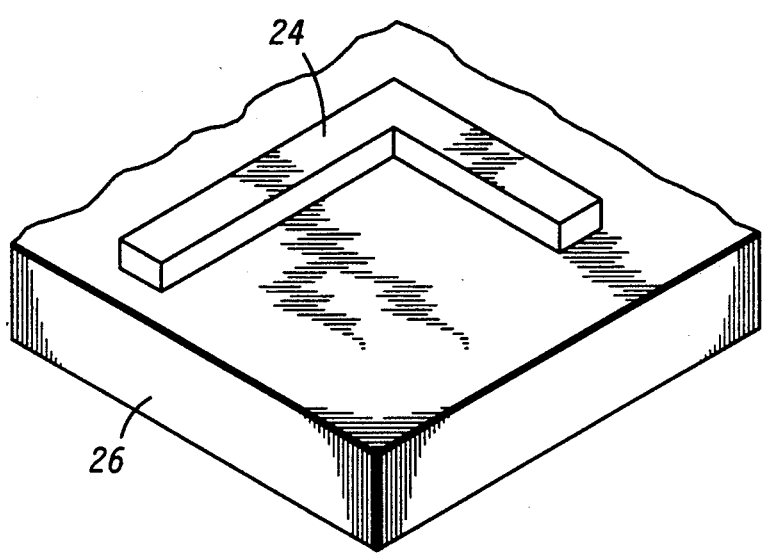
FIG. 4 is an example of a metal structure with sharp bends.

FIG. 4 is an isometric view of a metal structure with a sharp bend 24 on a semiconductor substrate 26. Structures of this kind are prone to have defects caused by increased local stresses. As current flows through this type of conductive structure, microstructural defects create increased current density in bend 24 disturbing the otherwise noise free flow of current in straight sections of the conductor. An increased voltage spectral density amplitude results from the current flow disruption.

Figure 5:
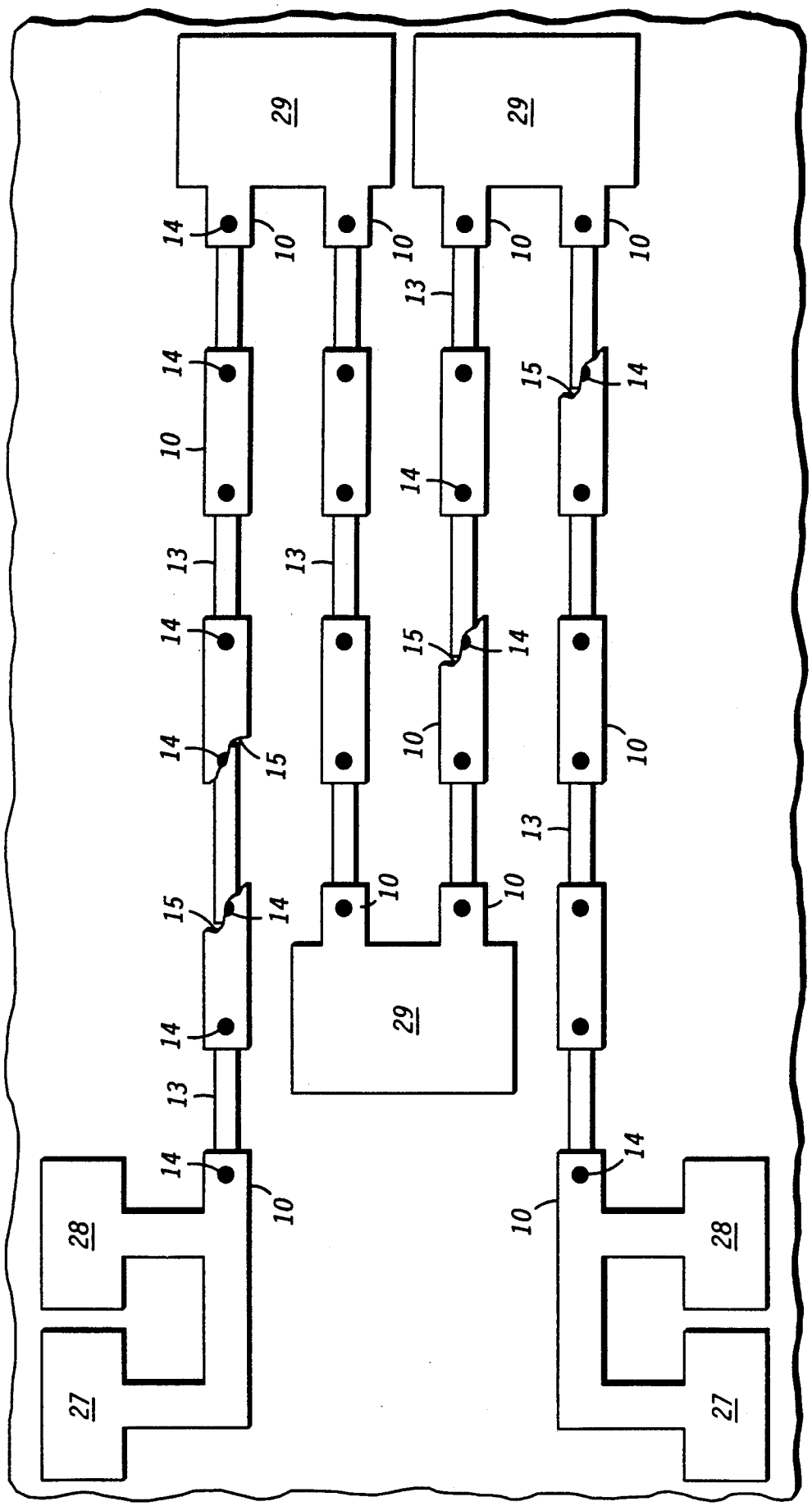
FIG. 5 is a plan view of a portion of a multi-layer metal structure providing for measurement by the defect detection system.

FIG. 5 is a greatly enlarged portion of a multilayer metal measurement structure. Upper conductive lines 10 and lower conductive lines 13 are separated (in a vertical direction) by an insulating material, and are connected with metal filled vias 14 to form a long metal structure. Cutaway 15 illustrates that 10 overlaps 13 to insure contact with 14. To minimize noise voltages created by increased current density in metal sections with sharp bends, large metal plates 29 are substituted where sharp bends would otherwise be necessary. If the plate width is greater than ten times the conducting line's width, disruption to current flow is negligible and the noise voltage is not noticeably increased. Two contact points 27 are provided for inducing current flow and another set of contact points 28 are used to measure voltages produced by the current flow. At the point of connection to a current source, contact points represent a potential noise voltage source. If the current source contacts 27 are placed sufficiently far from the voltage sensing contacts 28, smooth current flow can be reestablished in the conductor before the voltage is measured and noise voltage will be diminished. In a preferred embodiment, current source contact points 27 are located a minimum of 80 microns from the voltage measurement contacts 28. A defect free reference for a structure such as that shown in FIG. 5 can be developed by manufacturing and conducting voltage spectrum measurements on several samples. Those with low voltage spectrum magnitudes could be further analyzed, such as with SEM photos, to validate the defect free manufacturing. The verified sample's voltage spectrum magnitude would then become a reference to be used for verifying the integrity of all test structures manufactured.

The multi-layer metal measurement structure of FIG. 5 can be placed in the scribe grids or on individual die of a semiconductor wafer. Analysis of the structure's 1/f characteristics can be used to determine the presence of defects on that semiconductor wafer. In other words, if the test structure of FIG. 5 is found to be defect free, it is assumed that the manufacturing process is good and that the rest of the metalization on the wafer or die is also defect free.

FIG. 6 shows a multi-layer metal structure with upper metal lines 10 crossing a surface discontinuity. A lower layer metal line 13 on semiconductor material 26 forms a bulge or discontinuity 31 in the surface of insulator 11 that is covering lower metal line 13. Upper metal lines 10 cross discontinuity 20 along the surface of insulator 11. Semiconductor manufacturing processes cannot always maintain a constant cross sectional area in metal line 10 in these crossings. In such cases, thin area 33 can result where upper layer metal line 10 crosses discontinuities such as discontinuity 31. Thin area 33 can be detected by analyzing the increased voltage spectral density magnitude resulting from current flow through line 10.

FIG. 7 shows a layered metal structure having two dissimilar metals 34 and 36. The layered metal structure is formed by placing metals 34, 36 together during a deposition and heating them to a temperature that causes a molecular bond between the metal atoms along the surfaces where metals 34, 36 are in contact. The molecular bond or alloy interface 37 bonds the two materials together. During the deposition or bonding procedure a void 38 can result in the alloy interface if contamination (foreign particles, surface oxide, etc.) is present on the metal surfaces that are bonded together. Current flow is disturbed in the area of the void increasing the structure's voltage spectrum magnitude and permitting detection by 1/f analysis.

By now it should be appreciated that there has been provided a novel way to test the integrity of semiconductor conductive lines. This test is a non-destructive test that is easy to perform and fast to analyze. Many different types of defects in semiconductor metallic structures can be readily detected.

We claim:

1. A method for detecting defects in conductive lines on semiconductor devices which comprises:
    applying current to the conductive lines;
    measuring voltages induced by the current;
    determining a 1/f voltage spectral density of the measured voltages; and
    comparing the 1/f voltage spectral density to a predetermined reference for detecting the presence of voids in the conductive lines.

2. The method of claim 1 wherein the voltages are induced by applying a direct current having a current density range from 0.1 million amps per square centimeter to 3 million amps per square centimeter.

3. The method of claim 1 wherein said determining a 1/f voltage spectral density of the measured voltages includes using Fast Fourier transform techniques.

4. The method of claim 1 wherein comparing the 1/f voltage spectral density to a predetermined reference includes comparing within 1 Hz to 51 Hz frequency range.

5. A method for measuring the integrity of semiconductor metal structures having a plurality of metal layers interconnected by vias, wherein each metal layer may have sharp bends, or cross surface discontinuities, which comprises:
    applying a direct current to the structure;
    measuring voltages induced along a section of the structure by the direct current;
    utilizing a transform algorithm to convert the voltage measurements to a 1/f voltage spectrum; and
    comparing said 1/f voltage spectrum to a predetermined reference within a 1 Hz to 51 Hz range in order to detect defects in the metal structure.

6. The method of claim 5 wherein the measuring voltage step includes measuring voltages of generally non-periodic frequencies that result from the applied direct current.

7. The method of claim 5 wherein comparing said 1/f voltage spectrum includes comparing to a defect free metal structure's 1/f voltage spectrum.

8. A semiconductor multi-layer metal system measurement structure for determining defects in the metal system, comprising:
    a plurality of sections of upper and lower metal lines alternately placed with the trailing end of one section overlapping the leading end of the next section wherein the metal lines have a predetermined width;
    vias connecting the overlapping section end points to create and electrically and mechanically continuous structure having a beginning point and a terminating point;
    means for contacting the beginning and terminating points and applying a current; and
    means for contacting the structure and measuring a low frequency noise voltage to determine a 1/f voltage spectral density.

9. The measurement structure of claim 8 further including sharp bends which are formed with metal areas having a width greater than ten times the predetermined width of the metal lines.

10. The measurement structure of claim 8 wherein the means for applying a current is a located a distance greater than 80 microns from the means for measuring voltage.

11. A method for measuring the integrity of semiconductor layered metal structures which comprises:
    applying a direct current to the structure;
    measuring voltages having generally non-periodic frequencies that are induced by the direct current;
    converting the measured voltages to a 1/f voltage spectral density; and
    comparing the 1/f voltage spectral density to a predetermined reference to detect defects in the metal structure.

12. The method of claim 11 wherein comparing the 1/f voltage spectral density includes comparing within a 1 Hz to 51 Hz range to a reference having desired values.

* * * * *